US009048859B2

(12) United States Patent
Carty

(10) Patent No.: US 9,048,859 B2
(45) Date of Patent: Jun. 2, 2015

(54) METHOD AND APPARATUS FOR COMPRESSING AND DECOMPRESSING DATA

(75) Inventor: Christopher Paul Carty, London (GB)

(73) Assignee: Sony Computer Entertainment Europe Limited (GB)

( * ) Notice: Subject to any disclaimer, the term of this patent is extended or adjusted under 35 U.S.C. 154(b) by 740 days.

(21) Appl. No.: 12/665,164

(22) PCT Filed: Jun. 13, 2008

(86) PCT No.: PCT/GB2008/002031
§ 371 (c)(1),
(2), (4) Date: May 17, 2010

(87) PCT Pub. No.: WO2008/155523
PCT Pub. Date: Dec. 24, 2008

(65) Prior Publication Data
US 2010/0250864 A1  Sep. 30, 2010

(30) Foreign Application Priority Data
Jun. 19, 2007  (GB) .................................. 0711840.9

(51) Int. Cl.
G06F 12/00 (2006.01)
H03M 7/30 (2006.01)
G06F 9/445 (2006.01)

(52) U.S. Cl.
CPC *H03M 7/30* (2013.01); *G06F 9/445* (2013.01)

(58) Field of Classification Search
USPC ........................................................ 711/147
See application file for complete search history.

(56) References Cited

U.S. PATENT DOCUMENTS

| 5,729,228 A | 3/1998 | Franaszek et al. |
| 6,417,789 B1 | 7/2002 | Har et al. |
| 2002/0091905 A1 | 7/2002 | Geiger et al. |

(Continued)

FOREIGN PATENT DOCUMENTS

| GB | 2319366 A | 5/1998 |
| WO | 2006035989 A2 | 4/2006 |

OTHER PUBLICATIONS

International Search Report, PCT/GB2008/002031, dated Mar. 16, 2008.

(Continued)

*Primary Examiner* — Jared Rutz
*Assistant Examiner* — Hamdy S Ahmed
(74) *Attorney, Agent, or Firm* — Lerner, David, Littenberg, Krumholz & Mentlik, LLP

(57) ABSTRACT

One embodiment of the invention provides a method and apparatus for decompressing a compressed data set using a processing device having a plurality of processing units and a tangible, non-transitory shared memory. The compressed data set comprises a plurality of compressed data segments, in which each compressed data segment corresponds to a predetermined size of uncompressed data. The method includes loading the compressed data set into the shared memory so that each compressed data segment is stored into a respective memory region of the shared memory. The respective memory region has a size equal to the predetermined size of the corresponding uncompressed data segment. The method further includes decompressing the compressed data segments with the processing units; and storing each decompressed data segment back to its respective memory region within the shared memory.

19 Claims, 8 Drawing Sheets

(56) References Cited

U.S. PATENT DOCUMENTS

2002/0101367 A1  8/2002  Geiger et al.
2005/0262479 A1  11/2005  Ageyev et al.
2006/0291505 A1* 12/2006  Li ................................ 370/474

OTHER PUBLICATIONS

Search Report from Corresponding GB Application No. 0711840.9, dated Aug. 13, 2007.
Jeff Gilchrist and Aysegul Cuhadar: "Parallel Lossless Data Compression Based on the Burrows-Wheeler Transform" IEEE 21st International Conference on Advanced Networking and Applications (AINA'07), [Online] May 21, 2007, May 23, 2007 XP002521141 Niagara Falls, Canada Retrieved from the Internet: URL: http://ieeexpl ore.i eee. org/stamp/stampjsp?arnumber=04220984> abstract.
James Lemley: "nigzip README" Internet Article, [Online] Feb. 13, 2003, XP002521140 Retrieved from the Internet: URL : http ://l emley. net/mgzi p__README .txt> [retrieved on Mar. 25, 2009] p. 3.
European Examination for Application No. 08762360.69 dated Jun. 22, 2012.
Oberhumer, M.: "LZO Frequently Asked Questions", Oberhumer's website, Oct. 17, 2005, Retrieved from the Internet: URL:http://www.oberhumer.com/opensource/lzo/download/lzo-2.02.tar.gz.
Markus Oberhumer, Laszlo Molnar & John Reiser: 11Upx—compress or expand executable files II, UPX Sourceforge, Apr. 27, 2007, pp. 1-17, Retrieved from the Internet: <URL:http://upx.sourceforge.net/download/OO-OLD-VERSIONS/upx-3.00-powerpc__linux.tar.bz2>.
Summons to attend oral proceedings for application No. EP 08762360.9 dated Jul. 12, 2013.

* cited by examiner

METHOD AND APPARATUS FOR COMPRESSING AND DECOMPRESSING DATA

CROSS REFERENCE TO RELATED APPLICATIONS

The present application is a national phase entry under 35 U.S.C. §371 of International Application No. PCT/GB2008/002031, filed Jun. 13, 2008, published in English, which claims the benefit of GB Patent Application No. 0711840.9, filed Jun. 19, 2007. The entire disclosures of each of the above-identified applications are incorporated by reference herein.

The invention relates to the compression and decompression of data, especially in a device having multiple processing units.

In recent years, it has become common to use multiple systems operating in parallel to enhance the performance of computers and other processing devices. Thus rather than looking to further increase the clock speed of microprocessors (which can cause thermal problems), such devices are now being provided with multiple cores or other processing units for performing operations in parallel. For example, the Cell® processor, as used in the Sony Playstation 3® entertainment device, has a main processor, referred to as the Power Processing Element (PPE), and eight co-processors referred to as Synergistic Processing Elements (SPEs).

It is well-known that the move to parallelism causes potential programming difficulties, in that a linear sequence of operations can no longer be assumed. This can lead to problems such as deadlocks, race conditions, and so on.

The use of parallelism is especially attractive for computationally intensive tasks, such as compression and decompression. If a large data set is to be compressed, one option is to partition the data set into smaller segments. Each data set can then be compressed (or decompressed) independently of the other segments. Accordingly, compression (or decompression) of the individual segments can be allocated to different processing units for completion in parallel.

As an example, an 8 MB uncompressed file may be split into 128 segments, each of 64 KB. The compression of the different segments can then be shared across multiple processing units, with the results then being assembled to produce the final compressed file. Let us assume that each of the 128 segments is compressed down to 32 KB, so that the final file is 4 MB. For the decompression operation, the converse processing is performed. Each of the 128 segments is expanded from 32 KB back up to 64 KB, thereby returning from a 4 MB file to an 8 MB file.

During the decompression operation, one possibility is to allocate 4 MB in memory for the compressed file, and a separate 8 MB in memory for the location where the decompressed file is produced. This requires a total memory allocation of 12 MB. A more efficient use of memory is for the decompressed file to overwrite the compressed file.

FIG. 8 illustrates one approach to storing the decompressed file into the same memory space as where the compressed file was initially stored. Thus FIG. 8A illustrates a memory space having a low end (L) and a high end (H). A file comprising sixteen equal compressed segments (0-F) is written into the low end of the memory space, while region 11 of the memory space is initially unoccupied. The compressed segments are depicted with diagonal shading in FIG. 8A. It is assumed that each compressed segment has half the volume of the corresponding uncompressed segment.

The decompression commences by first decompressing the segment at the highest memory location occupied by the compressed data, namely segment F, and then saving the decompressed data segment into the empty memory region 11 at the highest available memory location. The next highest compressed segment, namely segment E, is then likewise decompressed, and again saved into the empty memory region 11 at the highest available memory location (immediately below the uncompressed segment F).

As this process continues, it leads to the situation shown in FIG. 8B, whereby segments F-9 have now been decompressed. The decompressed segments are depicted with dotted shading in FIG. 8B. There is now only empty memory space 11 remaining for one further decompressed segment, which will be segment 8. After this, the decompressed data starts to overwrite the original compressed data. Thus decompressed segment 7 will overwrite compressed segments E and F, while decompressed segment 6 will overwrite compressed segments C and D. However, no data is lost, since segments E and F have already been decompressed and saved by the time that they are overwritten by decompressed segment 7, and likewise segments C and D have already been decompressed and saved by the time that they are overwritten by decompressed segment 6.

As this process continues, it leads to the situation shown in FIG. 8C, whereby segments F-2 have now been decompressed. There are two remaining segments to decompress, namely segments 0 and 1. When segment 1 is decompressed, it overwrites compressed segments 2 and 3, and when segment 0 is decompressed, it overwrites compressed segments 0 and 1. This leads to the result that the memory space is now fully occupied with the decompressed data.

The above processing relies upon the fact that the data segments are decompressed in sequence. However, in a parallel environment, this does not necessarily happen. For example, imagine the situation from FIG. 8C, where the two remaining compressed segments, namely 0 and 1, are despatched to different processing units for decompression. It may be that the decompression of segment 0 occurs very rapidly, and completes before the compressed data for segment 1 has been fully processed (or loaded into the relevant processing unit). In these circumstances, if the decompressed data for segment 0 is written to its correct location (at the lowest end of the memory space), this will overwrite the as yet unprocessed compressed data for segment 1; in other words, the data for segment 1 may be lost.

One way to overcome this problem would be to initially save the decompressed data for segment 0 to the memory region currently occupied by compressed data segments 2 and 3 (which have already been decompressed and saved). The decompressed data for segment 1, when received later, would be written to the lowest end of the memory, currently occupied by compressed data segments 0 and 1. The decompressed data for segments 0 and 1 would then have to be swapped or reordered to assemble the data set back to its correct sequence.

However, such a procedure is potentially complex and time-consuming. Firstly, each processing unit, when writing data back to memory, would need to decide where in memory to save the data. The chosen locations would then need to be tracked to allow the re-ordering to be performed after the decompression had completed.

Another approach, which is more commonly adopted for parallel (out-of-order) execution, would be to impose some sequentiality on the system. For example, in the above situation, the processing unit which produced the decompressed data for segment 0 would be suspended until the decompressed data for segment 1 had been obtained and saved, whereupon the decompressed data for segment 0 could now be safely written back to the memory space. Unfortunately, introducing such restrictions and inter-dependencies between different processing units reduces the potential benefits that can be gained through the use of parallel processing.

One embodiment of the invention provides a method of decompressing a compressed data set using a processing device having a plurality of processing units and a shared memory, the compressed data set comprising a plurality of compressed data segments, in which each compressed data segment corresponds to an uncompressed size of uncompressed data, the method comprising: loading the compressed data set into the shared memory so that each compressed data segment is stored into a respective memory region of the shared memory, wherein the respective memory region has a size equal to the uncompressed size of the corresponding uncompressed data segment; decompressing the compressed data segments with the processing units; and storing each decompressed data segment back to its respective memory region within the shared memory, in which the loading comprises: loading the compressed data set into the shared memory so that the plurality of compressed data segments are arranged contiguously within the shared memory; and fragmenting the compressed data set into the plurality of compressed data segments so that each compressed data segment is stored into the respective memory region of the shared memory.

This approach allows both the compressed and decompressed data to be contained within a single memory space (generally corresponding to the size of the decompressed data). In addition, different data segments may be processed in parallel with one another by the different processing units without having to worry about over-writing data for other data segments.

In one embodiment, the data segments can be decompressed independently of one another. This allows the full parallel capabilities of the multiple processing units to be exploited. In other embodiments however, there may be partial or full ordering imposed on the decompression sequence for the data set.

In one embodiment, each of the data segments has the same uncompressed size of uncompressed data. Each processing unit has a local output buffer for holding data prior to storing back to shared memory. The local output buffer has a size equal to the uncompressed size of uncompressed data. In other embodiments, the uncompressed data segments may have a variable size, and/or the uncompressed size may differ from the size of the local output buffer. For example, the uncompressed size may reflect a suitable amount of data for independent processing by a processing unit.

In one embodiment, the compressed data set is loaded into a portion of memory equal to the size of the uncompressed data set. The compressed data set is located at a first end of the memory portion and the fragmenting comprises moving or copying the compressed data segments in turn away from this first end towards the opposite end, starting with the compressed data segment furthest from the first end.

In one embodiment, the fragmenting is performed as a serial process, for example by one of the processing units. In other embodiments, some parallel algorithm might be adopted for the fragmentation, and/or the fragmentation might be controlled by a separate device, for example a central processing unit.

In one embodiment, each respective memory region is arranged contiguously within the shared memory.

Another embodiment of the invention provides an apparatus for decompressing a compressed data set, the compressed data set comprising a plurality of compressed data segments, in which each compressed data segment corresponds to an uncompressed size of uncompressed data, the apparatus comprising: a plurality of processing units; and a shared memory; in which the apparatus is operable to: load the compressed data set into the shared memory so that each compressed data segment is stored into a respective memory region of the shared memory, wherein the respective memory region has a size equal to the uncompressed size of the corresponding uncompressed data segment; decompress the compressed data segments with the processing units; and store each decompressed data segment back to its respective memory region within the shared memory, in which the apparatus is operable to: load the compressed data set into the shared memory so that the plurality of compressed data segments are arranged contiguously within the shared memory; and fragment the compressed data set into the plurality of compressed data segments so that each compressed data segment is stored into the respective memory region of the shared memory.

In one embodiment, each respective memory region is arranged contiguously within the shared memory.

A computer program for implementing a method such as described above may also be provided in accordance with one embodiment of the invention.

Various embodiments of the invention will now be described in detail by way of example only with reference to the following drawings.

DETAILED DESCRIPTION

Figure 1:
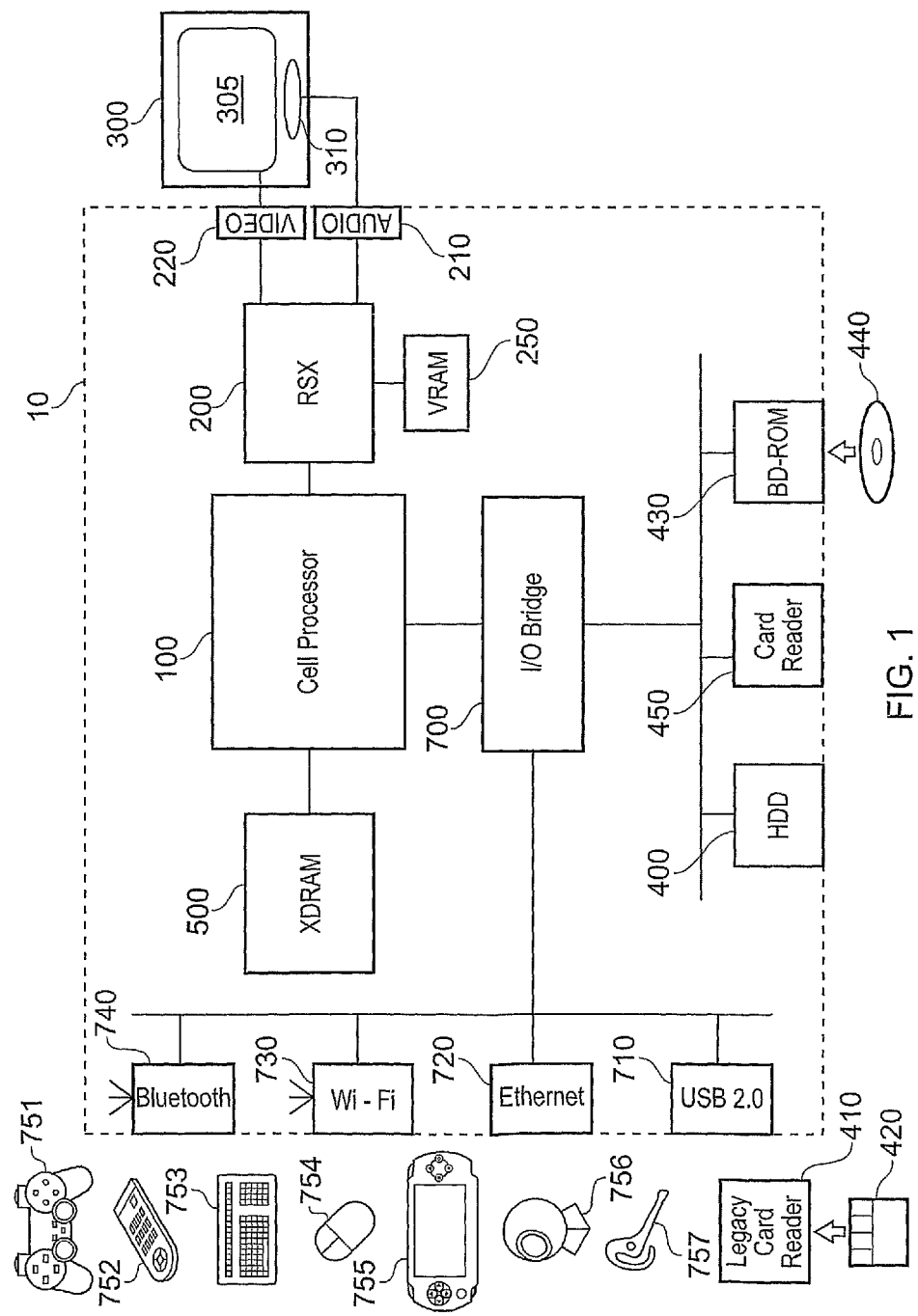
FIG. 1 is a schematic diagram of a Sony Playstation 3 entertainment device.

FIG. 1 schematically illustrates the overall system architecture of the Sony® Playstation 3® entertainment device. A system unit 10 is provided, with various peripheral devices connectable to the system unit.

The system unit 10 comprises: a Cell processor 100; a Rambus® dynamic random access memory (XDRAM) unit 500; a Reality Synthesiser graphics unit 200 with a dedicated video random access memory (VRAM) unit 250; and an I/O bridge 700.

The system unit 10 also comprises a Blu Ray® Disk BD-ROM® optical disk reader 430 for reading from a disk 440 and a removable slot-in hard disk drive (HDD) 400, accessible through the I/O bridge 700. Optionally the system unit also comprises a memory card reader 450 for reading compact flash memory cards, Memory Stick® memory cards and the like, which is similarly accessible through the I/O bridge 700.

The I/O bridge 700 also connects to four Universal Serial Bus (USB) 2.0 ports 710; a gigabit Ethernet port 720; an IEEE 802.11b/g wireless network (Wi-Fi) port 730; and a Bluetooth® wireless link port 740 capable of supporting up to seven Bluetooth connections.

In operation the I/O bridge 700 handles all wireless, USB and Ethernet data, including data from one or more game controllers 751. For example when a user is playing a game, the I/O bridge 700 receives data from the game controller 751 via a Bluetooth link and directs it to the Cell processor 100, which updates the current state of the game accordingly.

The wireless, USB and Ethernet ports also provide connectivity for other peripheral devices in addition to game controllers 751, such as: a remote control 752; a keyboard 753; a mouse 754; a portable entertainment device 755 such as a Sony Playstation Portable® entertainment device; a video camera such as an EyeToy® video camera 756; and a microphone headset 757. Such peripheral devices may therefore in principle be connected to the system unit 10 wirelessly; for example the portable entertainment device 755 may communicate via a Wi-Fi ad-hoc connection, whilst the microphone headset 757 may communicate via a Bluetooth link.

The provision of these interfaces means that the Playstation 3 device is also potentially compatible with other peripheral devices such as digital video recorders (DVRs), set-top boxes, digital cameras, portable media players, Voice over IP telephones, mobile telephones, printers and scanners.

In addition, a legacy memory card reader 410 may be connected to the system unit via a USB port 710, enabling the reading of memory cards 420 of the kind used by the Playstation® or Playstation 2® devices.

In the present embodiment, the game controller 751 is operable to communicate wirelessly with the system unit 10 via the Bluetooth link. However, the game controller 751 can instead be connected to a USB port, thereby also providing power by which to charge the battery of the game controller 751. In addition to one or more analogue joysticks and conventional control buttons, the game controller is sensitive to motion in 6 degrees of freedom, corresponding to translation and rotation in each axis. Consequently gestures and movements by the user of the game controller may be translated as inputs to a game in addition to or instead of conventional button or joystick commands. Optionally, other wirelessly enabled peripheral devices such as the Playstation Portable device may be used as a controller. In the case of the Playstation Portable device, additional game or control information (for example, control instructions or number of lives) may be provided on the screen of the device. Other alternative or supplementary control devices may also be used, such as a dance mat (not shown), a light gun (not shown), a steering wheel and pedals (not shown) or bespoke controllers, such as a single or several large buttons for a rapid-response quiz game (also not shown).

The remote control 752 is also operable to communicate wirelessly with the system unit 10 via a Bluetooth link. The remote control 752 comprises controls suitable for the operation of the Blu Ray Disk BD-ROM reader 430 and for the navigation of disk content.

The Blu Ray Disk BD-ROM reader 430 is operable to read CD-ROMs compatible with the Playstation and PlayStation 2 devices, in addition to conventional pre-recorded and recordable CDs, and so-called Super Audio CDs. The reader 430 is also operable to read DVD-ROMs compatible with the Playstation 2 and PlayStation 3 devices, in addition to conventional pre-recorded and recordable DVDs. The reader 430 is further operable to read BD-ROMs compatible with the Playstation 3 device, as well as conventional pre-recorded and recordable Blu-Ray Disks.

The system unit 10 is operable to supply audio and video, either generated or decoded by the Playstation 3 device via the Reality Synthesiser graphics unit 200, through audio and video connectors to a display and sound output device 300 such as a monitor or television set having a display 305 and one or more loudspeakers 310. The audio connectors 210 may include conventional analogue and digital outputs whilst the video connectors 220 may variously include component video, S-video, composite video and one or more High Definition Multimedia Interface (HDMI) outputs. Consequently, video output may be in formats such as PAL or NTSC, or in 720p, 1080i or 1080p high definition.

Audio processing (generation, decoding and so on) is performed by the Cell processor 100. The Playstation 3 device's operating system supports Dolby® 5.1 surround sound, Dolby® Theatre Surround (DTS), and the decoding of 7.1 surround sound from Blu-Ray® disks.

In the present embodiment, the video camera 756 comprises a single charge coupled device (CCD), an LED indicator, and hardware-based real-time data compression and encoding apparatus so that compressed video data may be transmitted in an appropriate format such as an intra-image based MPEG (motion picture expert group) standard for decoding by the system unit 10. The camera LED indicator is arranged to illuminate in response to appropriate control data from the system unit 10, for example to signify adverse lighting conditions. Embodiments of the video camera 756 may variously connect to the system unit 10 via a USB, Bluetooth or Wi-Fi communication port. Embodiments of the video camera may include one or more associated microphones and also be capable of transmitting audio data. In embodiments of the video camera, the CCD may have a resolution suitable for high-definition video capture. In use, images captured by the video camera may for example be incorporated within a game or interpreted as game control inputs.

In general, in order for successful data communication to occur with a peripheral device such as a video camera or remote control via one of the communication ports of the system unit 10, an appropriate piece of software such as a device driver should be provided. Device driver technology is well-known and will not be described in detail here, except to say that the skilled man will be aware that a device driver or similar software interface may be required in the present embodiment described.

Figure 2:
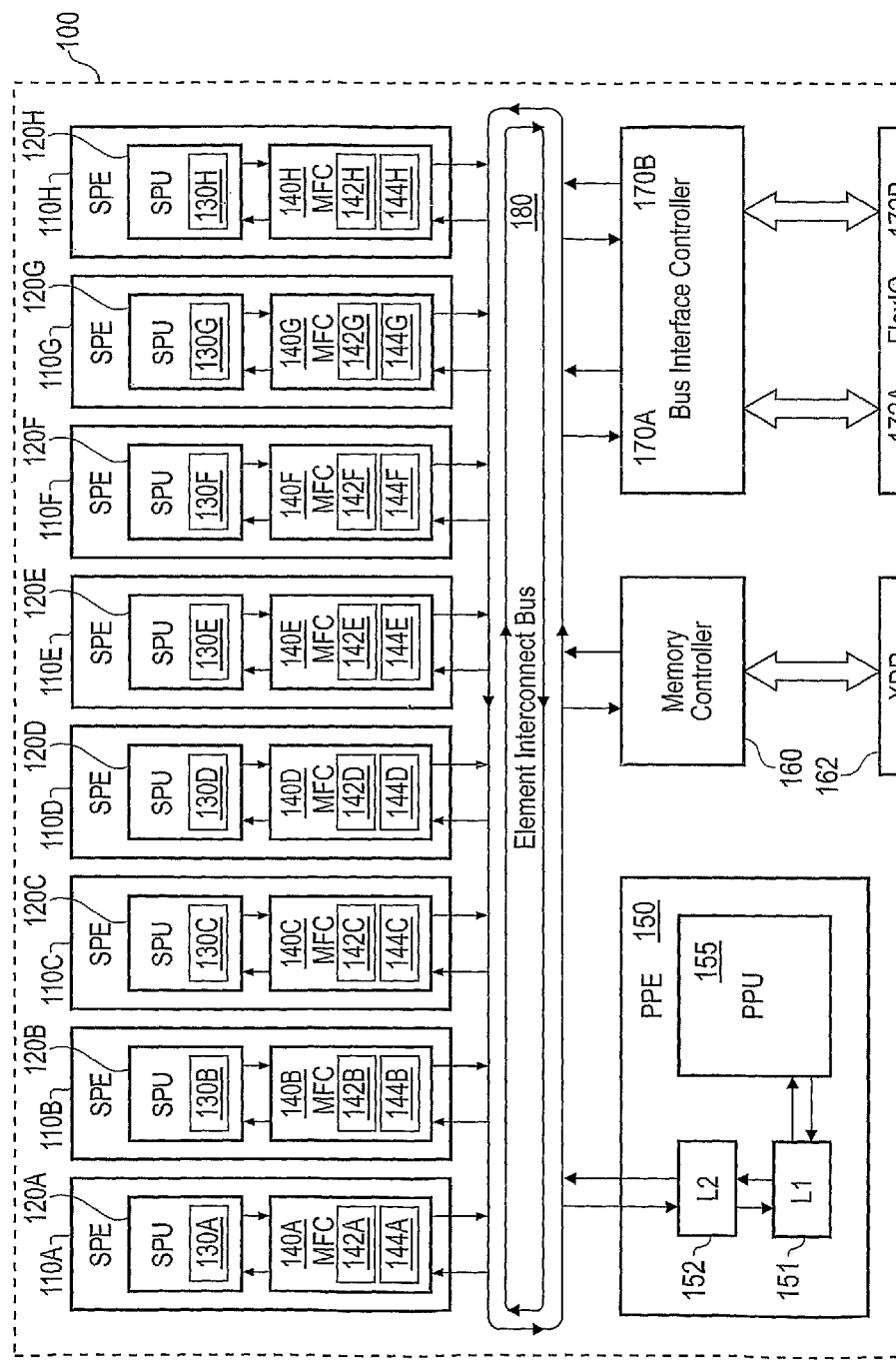
FIG. 2 is a schematic diagram of the Cell processor of the Sony Playstation 3 entertainment device of FIG. 1.

Referring now to FIG. 2, the Cell processor 100 has an architecture comprising four basic components: external input and output structures comprising a memory controller 160 and a dual bus interface controller 170A,B; a main processor referred to as the Power Processing Element 150; eight co-processors referred to as Synergistic Processing Elements (SPEs) 110A-H; and a circular data bus connecting the above components referred to as the Element Interconnect Bus 180. The total floating point performance of the Cell processor is 218 GFLOPS, compared with the 6.2 GFLOPs of the Playstation 2 device's Emotion Engine.

The Power Processing Element (PPE) 150 is based upon a two-way simultaneous multithreading Power 970 compliant PowerPC core (PPU) 155 running with an internal clock of 3.2 GHz. It comprises a 512 kB level 2 (L2) cache and a 32 kB level 1 (L1) cache. The PPE 150 is capable of eight single position operations per clock cycle, translating to 25.6

GFLOPs at 3.2 GHz. The primary role of the PPE 150 is to act as a controller for the Synergistic Processing Elements 110A-H, which handle most of the computational workload. In operation the PPE 150 maintains a job queue, scheduling jobs for the Synergistic Processing Elements 110A-H and monitoring their progress. Consequently each Synergistic Processing Element 110A-H runs a kernel whose role is to fetch a job, execute it and synchronise with the PPE 150.

Each Synergistic Processing Element (SPE) 110A-H comprises a respective Synergistic Processing Unit (SPU) 120A-H, and a respective Memory Flow Controller (MFC) 140A-H comprising in turn a respective Dynamic Memory Access Controller (DMAC) 142A-H, a respective Memory Management Unit (MMU) 144A-H and a bus interface (not shown). Each SPU 120A-H is a RISC processor clocked at 3.2 GHz and comprising 256 kB local RAM 130A-H, expandable in principle to 4 GB. Each SPE gives a theoretical 25.6 GFLOPS of single precision performance. An SPU can operate on 4 single precision floating point members, 4 32-bit numbers, 8 16-bit integers, or 16 8-bit integers in a single clock cycle. In the same clock cycle it can also perform a memory operation. The SPU 120A-H does not directly access the system memory XDRAM 500; the 64-bit addresses formed by the SPU 120A-H are passed to the MFC 140A-H which instructs its DMA controller 142A-H to access memory via the Element Interconnect Bus 180 and the memory controller 160.

The Element Interconnect Bus (EIB) 180 is a logically circular communication bus internal to the Cell processor 100 which connects the above processor elements, namely the PPE 150, the memory controller 160, the dual bus interface 170A,B and the 8 SPEs 110A-H, totaling 12 participants. Participants can simultaneously read and write to the bus at a rate of 8 bytes per clock cycle. As noted previously, each SPE 110A-H comprises a DMAC 142A-H for scheduling longer read or write sequences. The EIB comprises four channels, two each in clockwise and anti-clockwise directions. Consequently for twelve participants, the longest step-wise dataflow between any two participants is six steps in the appropriate direction. The theoretical peak instantaneous EIB bandwidth for 12 slots is therefore 96 B per clock, in the event of full utilisation through arbitration between participants. This equates to a theoretical peak bandwidth of 307.2 GB/s (gigabytes per second) at a clock rate of 3.2 GHz.

The memory controller 160 comprises an XDRAM interface 162, developed by Rambus Incorporated. The memory controller interfaces with the Rambus XDRAM 500 with a theoretical peak bandwidth of 25.6 GB/s.

The dual bus interface 170A,B comprises a Rambus FlexIO® system interface 172A,B. The interface is organised into 12 channels each being 8 bits wide, with five paths being inbound and seven outbound. This provides a theoretical peak bandwidth of 62.4 GB/s (36.4 GB/s outbound, 26 GB/s inbound) between the Cell processor and the I/O Bridge 700 via controller 170A and the Reality Simulator graphics unit 200 via controller 170B.

Data sent by the Cell processor 100 to the Reality Simulator graphics unit 200 will typically comprise display lists, being a sequence of commands to draw vertices, apply textures to polygons, specify lighting conditions, and so on.

Figure 3:
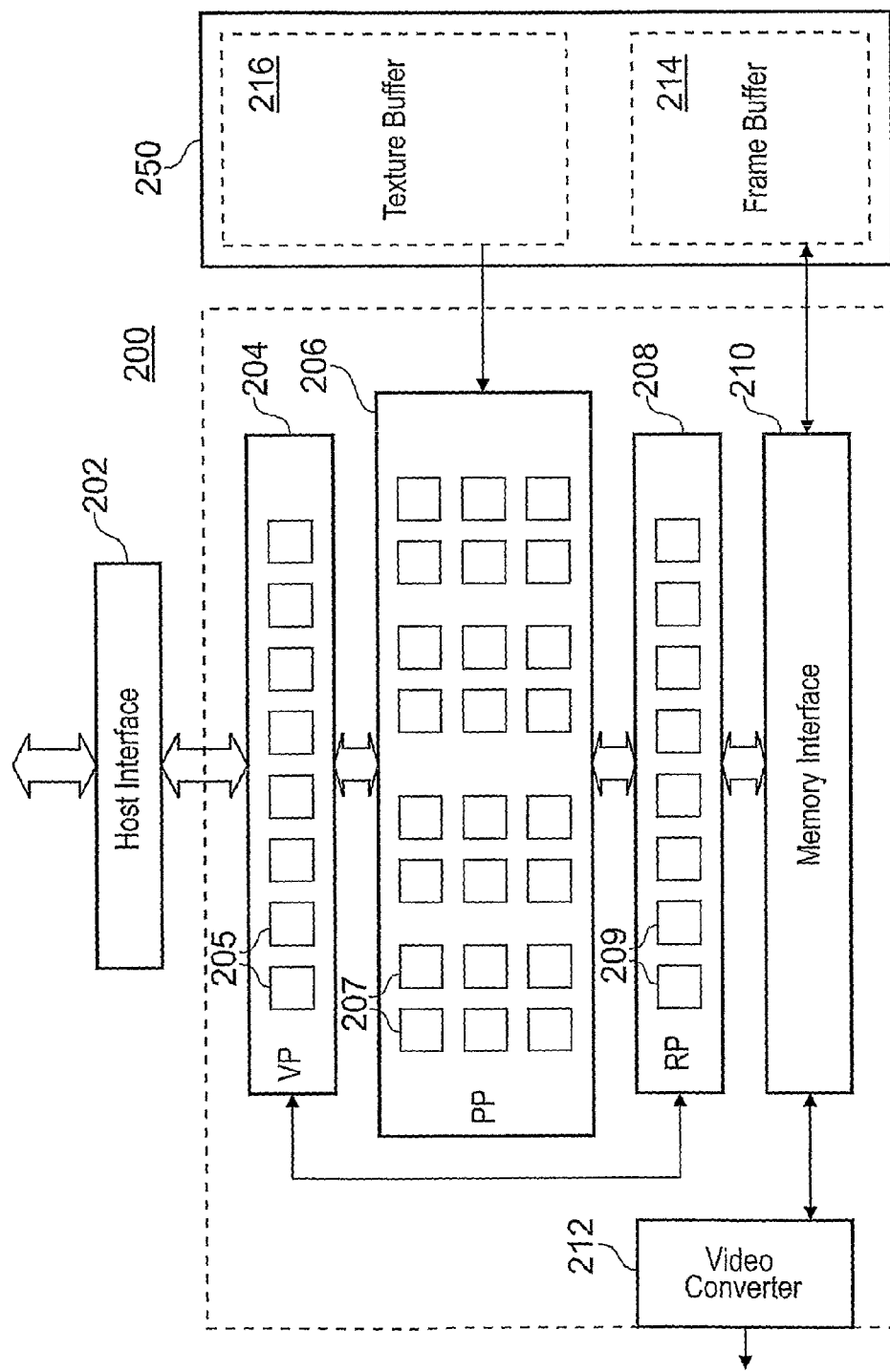
FIG. 3 is a schematic diagram of the graphics unit of the Sony Playstation 3 entertainment device of FIG. 1.

Referring now to FIG. 3, the Reality Simulator graphics (RSX) unit 200 is a video accelerator based upon the NVidia® G70/71 architecture that processes and renders lists of commands produced by the Cell processor 100. The RSX unit 200 comprises a host interface 202 operable to communicate with the bus interface controller 170B of the Cell processor 100; a vertex pipeline 204 (VP) comprising eight vertex shaders 205; a pixel pipeline 206 (PP) comprising 24 pixel shaders 207; a render pipeline 208 (RP) comprising eight render output units (ROPs) 209; a memory interface 210; and a video converter 212 for generating a video output. The RSX 200 is complemented by 256 MB double data rate (DDR) video RAM (VRAM) 250, clocked at 600 MHz and operable to interface with the RSX 200 at a theoretical peak bandwidth of 25.6 GB/s. In operation, the VRAM 250 maintains a frame buffer 214 and a texture buffer 216. The texture buffer 216 provides textures to the pixel shaders 207, whilst the frame buffer 214 stores results of the processing pipelines. The RSX can also access the main memory 500 via the EIB 180, for example to load textures into the VRAM 250.

The vertex pipeline 204 primarily processes deformations and transformations of vertices defining polygons within the image to be rendered.

The pixel pipeline 206 primarily processes the application of colour, textures and lighting to these polygons, including any pixel transparency, generating red, green, blue and alpha (transparency) values for each processed pixel. Texture mapping may simply apply a graphic image to a surface, or may include bump-mapping (in which the notional direction of a surface is perturbed in accordance with texture values to create highlights and shade in the lighting model) or displacement mapping (in which the applied texture additionally perturbs vertex positions to generate a deformed surface consistent with the texture).

The render pipeline 208 performs depth comparisons between pixels to determine which should be rendered in the final image. Optionally, if the intervening pixel process will not affect depth values (for example in the absence of transparency or displacement mapping) then the render pipeline and vertex pipeline 204 can communicate depth information between them, thereby enabling the removal of occluded elements prior to pixel processing, and so improving overall rendering efficiency. In addition, the render pipeline 208 also applies subsequent effects such as full-screen anti-aliasing over the resulting image.

Both the vertex shaders 205 and pixel shaders 207 are based on the shader model 3.0 standard. Up to 136 shader operations can be performed per clock cycle, with the combined pipeline therefore capable of 74.8 billion shader operations per second, outputting up to 840 million vertices and 10 billion pixels per second. The total floating point performance of the RSX 200 is 1.8 TFLOPS.

Typically, the RSX 200 operates in close collaboration with the Cell processor 100; for example, when displaying an explosion, or weather effects such as rain or snow, a large number of particles must be tracked, updated and rendered within the scene. In this case, the PPU 155 of the Cell processor may schedule one or more SPEs 110A-H to compute the trajectories of respective batches of particles. Meanwhile, the RSX 200 accesses any texture data (e.g. snowflakes) not currently held in the video RAM 250 from the main system memory 500 via the element interconnect bus 180, the memory controller 160 and a bus interface controller 170B. Each SPE 110A-H outputs its computed particle properties (typically coordinates and normals, indicating position and attitude) directly to the video RAM 250; the DMA controller 142A-H of each SPE 110A-H addresses the video RAM 250 via the bus interface controller 170B. Thus in effect the assigned SPEs become part of the video processing pipeline for the duration of the task.

In general, the PPU 155 can assign tasks in this fashion to six of the eight SPEs available; one SPE is reserved for the operating system, whilst one SPE is effectively disabled. The disabling of one SPE provides a greater level of tolerance during fabrication of the Cell processor, as it allows for one SPE to fail the fabrication process. Alternatively if all eight SPEs are functional, then the eighth SPE provides scope for redundancy in the event of subsequent failure by one of the other SPEs during the life of the Cell, processor.

The PPU 155 can assign tasks to SPEs in several ways. For example, SPEs may be chained together to handle each step in a complex operation, such as accessing a DVD, video and audio decoding, and error masking, with each step being assigned to a separate SPE. Alternatively or in addition, two or more SPEs may be assigned to operate on input data in parallel, as in the particle animation example above.

Software instructions implemented by the Cell processor 100 and/or the RSX 200 may be supplied at manufacture and stored on the HDD 400, and/or may be supplied on a data carrier or storage medium such as an optical disk or solid state memory, or via a transmission medium such as a wired or wireless network or internet connection, or via combinations of these.

The software supplied at manufacture comprises system firmware and the Playstation 3 device's operating system (OS). In operation, the OS provides a user interface enabling a user to select from a variety of functions, including playing a game, listening to music, viewing photographs, or viewing a video. The interface takes the form of a so-called cross media-bar (XMB), with categories of function arranged horizontally. The user navigates by moving through the function icons (representing the functions) horizontally using the game controller 751, remote control 752 or other suitable control device so as to highlight a desired function icon, at which point options pertaining to that function appear as a vertically scrollable list of option icons centred on that function icon, which may be navigated in analogous fashion. However, if a game, audio or movie disk 440 is inserted into the BD-ROM optical disk reader 430, the Playstation 3 device may select appropriate options automatically (for example, by commencing the game), or may provide relevant options (for example, to select between playing an audio disk or compressing its content to the HDD 400).

In addition, the OS provides an on-line capability, including a web browser, an interface with an on-line store from which additional game content, demonstration games (demos) and other media may be downloaded, and a friends management capability, providing on-line communication with other Playstation 3 device users nominated by the user of the current device; for example, by text, audio or video depending on the peripheral devices available. The on-line capability also provides for on-line communication, content download and content purchase during play of a suitably configured game, and for updating the firmware and OS of the Playstation 3 device itself. It will be appreciated that the term, "on-line" does not imply the physical presence of wires, as the term can also apply to wireless connections of various types.

The system unit 10 often handles data (images, text, audio, program code, etc) which has been compressed to reduce storage or communication requirements. This compressed data may be received over a network, such as ethernet 720 or wi-fi network 730, accessed from the hard disk drive 400 or an optical disk 430, or obtained from any other suitable source. The system unit 10 decompresses this data before using it. The decompression is performed by Cell processor 100, and more particularly by the SPEs 110A, 110B, etc. As previously indicated, each SPU has 256 KB of local RAM 130. In one embodiment, this is configured to provide a 64 KB input buffer and also a 64 KB output buffer (with the remaining RAM being used for general program operations, such as code, stack, etc).

In order to allow the SPEs to operate in parallel, we assume that the data has been compressed in independent segments, each representing 64 KB of uncompressed data. It will be appreciated that the 64 KB size for the data segments corresponds to the size of the output buffer of an SPU. Hence an SPU can output an uncompressed data segment as a whole (rather than having to split the uncompressed data segment into pieces for returning to main memory). We also assume at present that each compressed data segment has a fixed size of 32 KB.

Figure 4:
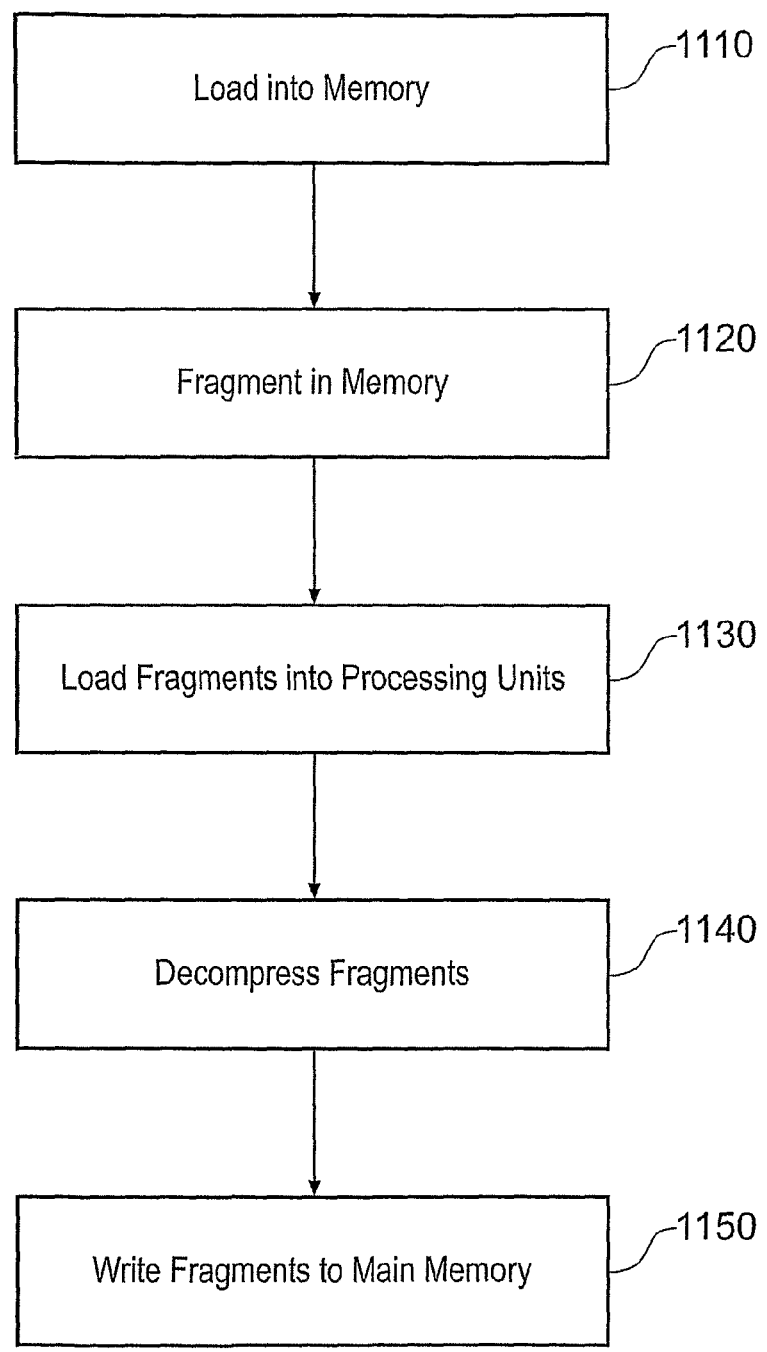
FIG. 4 is a flowchart of a method for decompressing data using the Sony Playstation 3 entertainment device of FIG. 1 in accordance with one embodiment of the invention.
Figure 5A:
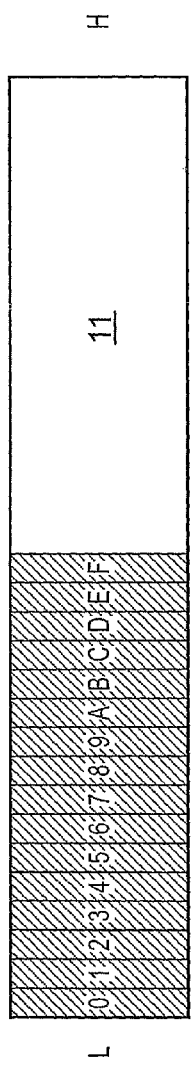
FIG. 5 (drawn as FIGS. 5A to 5C) is a schematic diagram of the use of memory when decompressing data by the method of FIG. 4 in accordance with one embodiment of the invention.
Figure 8A:
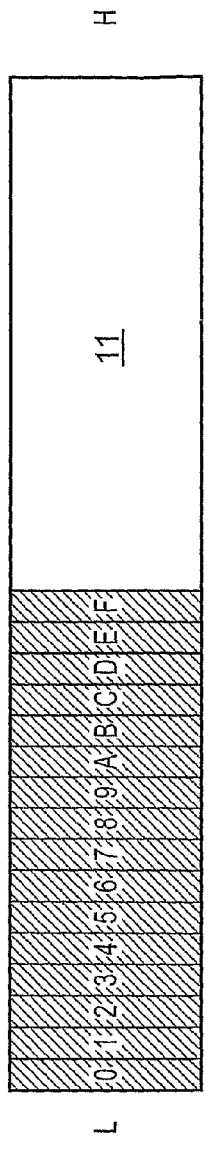
FIG. 8 (drawn as FIGS. 8A to 8C) is a schematic diagram of the use of memory when decompressing data using an approach not based on the method of FIG. 4.
Figure 8B:
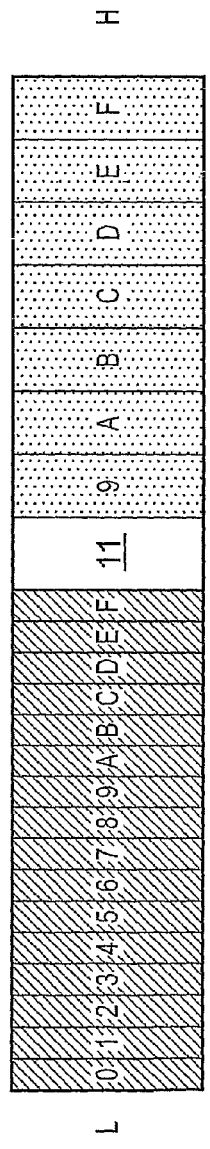
Figure 8C:
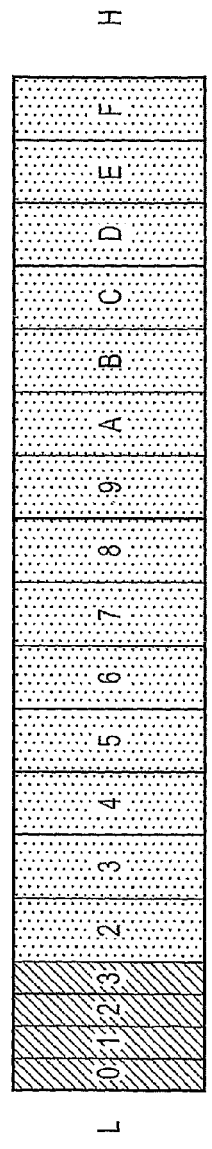

FIG. 4 is a flowchart depicting a method for decompressing a data set using system unit 10 in accordance with one embodiment of the invention. The method commences with the compressed data being written into a contiguous portion of memory (operation 1110). This leads to a situation such as shown in FIG. 5A, where 16 compressed data segments are loaded into the low end of a memory portion, with the high end 11 of the memory portion unoccupied. (It will be appreciated that this is also the starting configuration for the decompression processing discussed above in relation to FIG. 8).

The compressed data loaded into the main memory is now fragmented (operation 1120). In particular, each compressed data segment is allocated its own section of memory, where the size of the memory section (also referred to herein as a memory region) corresponds to the uncompressed size of the data segment, in this case 64 KB.

Figure 5B:
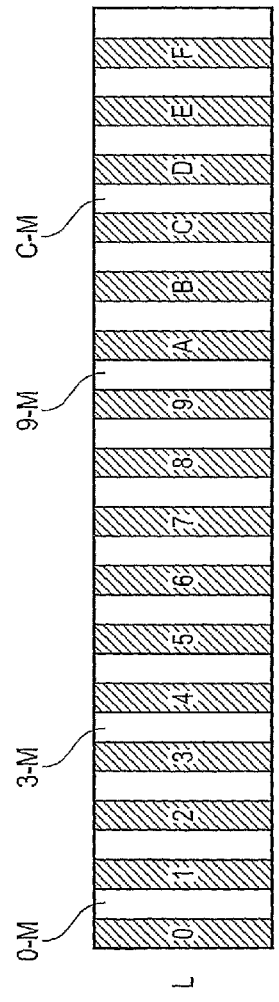

FIG. 5B illustrates one configuration of data in memory where this has been achieved. Thus each 64 KB section of memory contains a compressed data segment (32 KB), and a corresponding empty area of memory (also 32 KB). Thus the memory section for compressed data segment 0 includes empty memory area 0-M, the memory section for compressed data segment 3 includes empty memory area 3-M, the memory section for compressed data segment 9 includes empty memory area 9-M, the memory section for compressed data segment C includes empty memory area C-M, and so on.

One way to progress from the memory configuration of FIG. 5A to that of FIG. 5B is to work through each compressed data segment in turn, starting at the one with the highest memory location. The selected data segment is then assigned a 64 KB section of memory at the highest available memory location (allowing for memory that has already been assigned to other data segments). The selected data segment is then stored at the lowest address within the assigned data segment. The process then repeats until all the data segments are separated (fragmented) into their respective memory sections. Depending on the particular data set, in some cases one or more compressed data segments may not need movement during fragmentation, in that such segments are already located by the initial loading (prior to fragmentation) into the appropriate memory section for the corresponding uncompressed data.

The above approach for fragmentation preserves the ordering of the data segments within the data set. (In other embodiments, the ordering may potentially be varied, but this would then require a reordering step at the end to reassemble the decompressed file into the correct sequence).

In one embodiment, the fragmentation is performed by a single SPE and is linear (ordered). For example, compressed data segment E has to be moved before compressed data segment 7, otherwise the latter will overwrite the former before it is has moved or copied. This ordering can be readily accomplished by performing the fragmentation with just a single processing unit (e.g. an SPE or the PPE). Since the fragmentation is a relatively straightforward operation (compared to say decompression), it therefore can be accomplished quickly even without parallelisation. In addition, different fragmentation strategies might perhaps allow a more relaxed ordering for the relocation of the compressed data segments within memory.

In the embodiment of FIG. 5, it is assumed that the compressed data segments are moved from their initial positions in memory to their fragmented positions in memory. In other embodiments, the fragmentation may be achieved using a copy rather than a move operation. In this case, the memory section for storing a particular decompressed segment may contain both the compressed data for that segment and also the compressed data for another segment stored into the memory section prior to the fragmentation. For example, the memory space 0-M of FIG. 5B would be filled by the retained compressed data segment 1, and the memory space 3-M would be filled by the retained compressed data segment 7. However, this does not impact the overall decompression operation, since the retained (copied) compressed data segments would be overwritten in due course by the decompressed data.

In FIG. 5B, the fragmentation process locates all of the compressed data segments on the lower boundary of their respective memory section. However, the fragmentation may place a compressed data segment anywhere within the relevant memory section. For example, if a compressed data segment happens to be already located in the middle of its corresponding memory section prior to fragmentation, it may be left where it is, without aligning to a boundary of the memory section.

After the data has been fragmented, it is loaded into the SPEs for decompressing (operation 1130). Each compressed data segment can now be treated independently from the other compressed data segments (assuming that they are independent in terms of data compression). Therefore any suitable algorithm can be used to allocate the compressed data segments to the available SPEs for decompression, and the allocation can be performed in any desired order (not necessarily sequentially 0 through F or vice versa). This allows the decompression of at least some of the compressed data segments to be performed in parallel using different SPEs.

Note that the decompression for a data segment can commence as soon as that particular data segment has been fragmented to its correct location in memory (without having to wait for the fragmentation of all the other data segments to complete). This allows some of the fragmentation and decompression to be performed in parallel.

After the SPE has performed the decompression of a data segment (operation 1140), the decompressed data is written back to the same memory section from where it was loaded into the SPE (operation 1150). Since the decompressed data segment has a size of 64 KB, the decompressed data segment now occupies the entire memory section. As a result, adjacent decompressed data segments are contiguous with one another in memory.

Figure 5C:
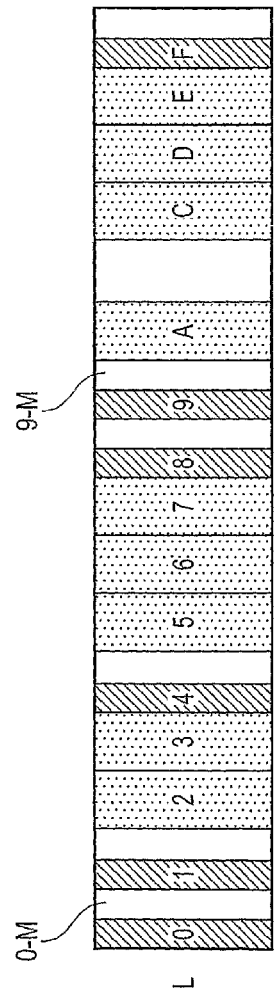

This leads to the situation shown in FIG. 5C, where it is assumed that the compression has been completed for data segments 2, 3, 5-7, A and C-E. For these segments, the original compressed data has been over-written by the corresponding decompressed data. The situation shown in FIG. 5C also has some data segments still waiting for the decompression to finish (data segments 0, 1, 4, 8, 9 and F). As shown in FIG. 5A, these memory sections still contain the compressed data, plus the corresponding empty memory space (e.g. 0-M, 9-M).

As the data decompression progresses, more and more data segments are saved to the memory in uncompressed form, thereby overwriting the original compressed data. Eventually all the compressed data segments are replaced by the uncompressed data. The uncompressed data then fills the entire memory region shown as a single contiguous data set which is now available for further processing by system unit 10.

It has been assumed in the above embodiment that the compressed data is always smaller, or at worst the same size, as the original, uncompressed data (otherwise it is difficult to determine the fragmentation spacing). In fact, this is not necessarily a property of all compression algorithms. Nevertheless, the compression process can be readily made to have this property by testing the size of each compressed data segment against the size of the corresponding uncompressed data segment. If the former is larger than the latter, the latter (uncompressed data) is used to represent the data segment in the compressed data set.

In one embodiment, the compressed data set is provided with a file header and Table of Contents (TOC). This can be used to indicate, for example, the compression algorithm used on the data set, and also whether any data segments are represented by uncompressed rather than compressed data (such segments could then be accessed directly if so desired, and do not need to be sent to an SPE for decompression). The file header and the TOC are often not required for (or part of) the uncompressed data set.

Figure 6A:
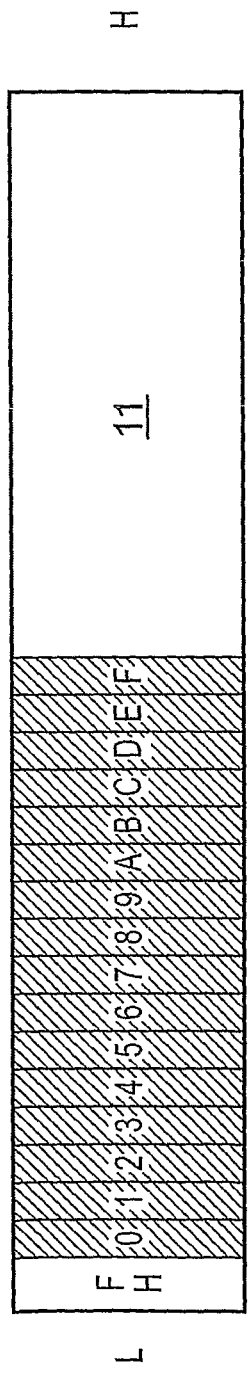
FIG. 6 (drawn as FIGS. 6A and 6B) is a schematic diagram of the use of memory when decompressing data by the method of FIG. 4 when the compressed data includes a file header in accordance with one embodiment of the invention.
Figure 6B:
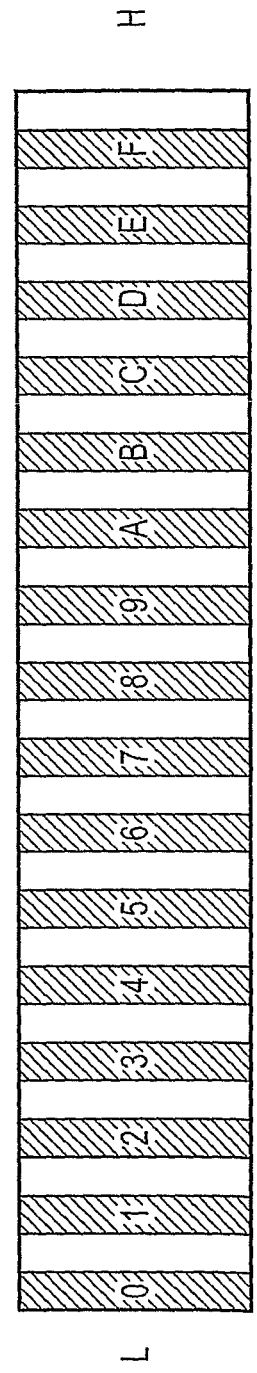

In one embodiment, the file header and TOC are copied into the local store (RAM) of an SPE prior to fragmentation. The file header and the TOC are then removed from the compressed data set as part of the fragmentation, as illustrated in FIG. 6. More particularly, FIG. 6A depicts the same data set as for FIG. 5A, but this time preceded by a file header and TOC (FH). FIG. 6B depicts the compressed data set of FIG. 6A after fragmentation (the configuration is now the same as for FIG. 5B). It can be seen that during the fragmentation, most compressed data segments have been moved to a higher memory location (as in FIG. 5). However, compressed data segment 0 has been moved instead to a lower memory location to overwrite the file header FH. Compressed data segment 1 is also moved to a lower memory location as part of the fragmentation, with the remaining compressed data segments 2-F moving to a higher memory location.

(In the example of FIG. 6, compressed data segment 0 is somewhat smaller than file header FH. Consequently, a portion of the file header FH would continue to be present between compressed data segment 0 and compressed data segment 1 after the fragmentation. However, this is omitted from FIG. 6B for ease of representation).

It will be appreciated that the decompression procedure described above is limited in its memory requirements to the size of the uncompressed data (rather than requiring separate memory regions for both the compressed and the uncompressed data). Furthermore, the decompression procedure supports full parallelism, in that each data segment can be decompressed independently from the other data segments and in any order. This enables the full benefit of the parallel architecture to be obtained, whereby different processors can work in parallel on decompressing different data segments.

In addition, the order in which the compressed data segments are decompressed can be changed as appropriate. This may be helpful if certain decompressed data segments may be needed before others. For example, the data set of FIG. 5B is being decompressed in response to a specifically request for (or predicted use of) data segment D, it may be desirable to decompress this data segment first. This may then allow other portions of system unit 10 to continue operations with the decompressed data segment D in parallel with the decompression of the remaining data segments. A further motivation for specifically configuring the order of decompression of the data segments is to allow for possible variations in expected decompression time (as discussed in more detail below).

In the embodiment described above, each data segment represents a fixed amount of uncompressed data. However, in other embodiments, the data segments may represent varying amounts of uncompressed data. In this latter case, it is assumed that the size of the uncompressed data can be otherwise determined, for example from file header information for the compressed data segment. This then allows the compressed data segments to be suitably dispersed (fragmented) in memory, with each compressed data segment allocated to a memory section which is the correct size for the uncompressed data in that segment (i.e. the uncompressed data should fill the memory section).

In the embodiment described above, the fixed size of each uncompressed data segment corresponds to the size of the output buffer of an SPU. It will be appreciated that in some embodiments, the processing units may not be provided with local RAM, but rather work directly with main memory (potentially with one or more levels of cache). In addition, the various processing units may not all be the same as one another; for example, some processing units may have a larger input and/or output buffer than other processing units. If the processing units are heterogeneous, this may impact the allocation of data segments to the processing units. For example, if the data segments themselves vary in size, then larger data segments might be preferentially allocated to those processing units with larger input/output buffers.

Furthermore the size of each uncompressed data segment may not correspond to the size of the output buffer of an SPU. This then allows the size of the uncompressed data segment to be chosen in accordance with other factors, such as the efficiency and performance of the compression/decompression algorithm, and/or the desired granularity of the parallelism (since a data segment represents the basic unit of work for allocation to a single SPE for processing). As an example, one option might be for an SPU with a 4 KB input buffer and 4 KB output buffer to stream through a larger compressed data segment, for example 1 MB. In this case, the compressed data segment would generally be right-aligned (i.e. at the high end) of its memory section, with any padding coming before the real data rather than after it (this would avoid the decompressed data over-writing any compressed data that had not yet been decompressed).

In the embodiment described above, there is a fixed size for each compressed data segment. For a given amount of input data, many compression algorithms produce a variable (data-dependent) size of output. This can be turned into a fixed size compressed data segment such as shown in FIG. 5 by appropriate padding (assuming that the data can always be compressed below the fixed size). In other embodiments however, the compressed data segments may be (very) variable in size, for example, ranging from 100 bytes up to 64 KB of raw (uncompressed) data.

The inherent data-dependence of many compression/decompression algorithms is one reason why the processing time for decompressing compressed data segments may vary from one data segment to another (thereby leading to potential out-of-order execution problems such as described above in relation to FIG. 8). If the size of the compressed data segments does vary, one possible approach is to select the largest compressed data segments to decompress first, on the basis that these largest data segments are generally expected to take longest to decompress.

In the embodiment described above, the compressed data segments can be decompressed independently of one another; nevertheless, the fragmentation approach of FIG. 5 may be used even where the compressed data segments do have a mutual dependency (for example, it may be that data segment 2 cannot be decompressed without first decompressing data segment 1). If the decompression sequence is completely specified (say data segments 0 through F in that order), then the approach of FIG. 8 may be adopted for the decompression. However, if the decompression sequence is only partly specified, for example in relation to data segments 2-6, but not for the remaining data segments, the approach of FIG. 5 is still valuable to address out-of-order execution problems. In addition, fragmentation might be employed where the degree of dependency between the compressed data segments cannot be immediately determined (this might only become apparent as the data sets are decompressed).

In the embodiments described above, the operations 1110 and 1120 described with respect to FIG. 4 may be carried out as one operation, in which the compressed data is written into the main memory so that each compressed data segment is allocated its own section of memory, and where the size of the memory section corresponds to the uncompressed size of the data segment (e.g. 64 KB in this case). In other words, the compressed data set may be loaded into the main memory in such a way as to arrive at the memory configuration shown in FIG. 5B, without the compressed data set first being contiguously loaded into the memory configuration shown in FIG. 5A and then fragmented to arrive at the memory configuration shown in FIG. 5B.

In one embodiment, the memory sections are arranged contiguously within the main memory so that the ordering of the data segments within the data set is preserved. However, it will be appreciated that, in other embodiments, the order in which the compressed data segments are written into the memory sections may be varied and subsequently reordered at the end of the process so as to reassemble the file into the correct sequence.

It will be appreciated that there may be a minimum size for the compressed data segments. For example, CD-ROMs typically store data in 2 KB sectors. Therefore, if a simple direct memory access (DMA) operation is carried out to read the data sectors from the CD-ROM to the main memory, the 2 KB data sector would be written into a 4 KB memory section so as to create the memory arrangement shown in FIG. 5B (assuming that a 2:1 compression ratio was used to compress the data sectors). However, it will be appreciated that other methods of reading data from a storage medium and writing the data to the main memory could be used.

Where, for example, the storage medium is a CD-ROM, the memory controller 160 can read sixteen 2 KB data sectors (forming a total of 32 KB) from the CD-ROM and write these into a 64 KB memory section as described above so that the 2 KB sectors are arranged contiguously within the 64 KB memory section. Another sixteen 2 KB sectors can then be loaded in a similar manner into the next 64 KB memory section and so on so as to arrive at the memory configuration shown in FIG. 5B. This allows for optimum usage of the SPEs. Decompression can then be carried out on each memory section as previously described.

In other words, the memory controller 160 can control the writing of data into the main memory in any suitable manner so as to arrive at the memory configuration shown in FIG. 5B, although it will be appreciated that other processing elements could be used to achieve this functionality. Additionally, it will be appreciated that data can be loaded into the main memory in a similar manner to that described above from other suitable storage media such as a Blu-Ray disc.

Figure 7A:
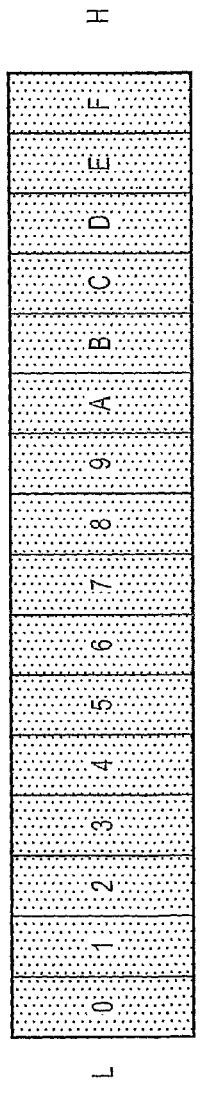
FIG. 7 (drawn as FIGS. 7A to 7C) is a schematic diagram of the use of memory when compressing data in accordance with one embodiment of the invention.
Figure 7B:
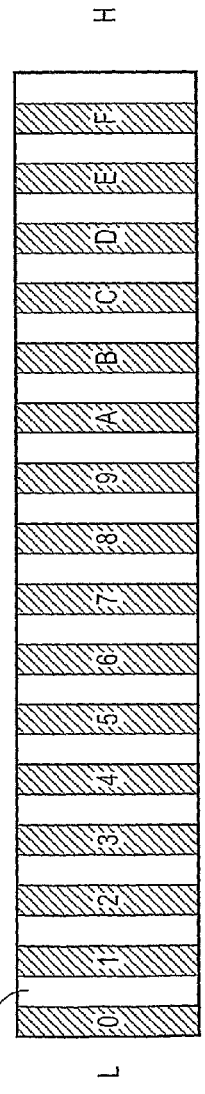
Figure 7C:
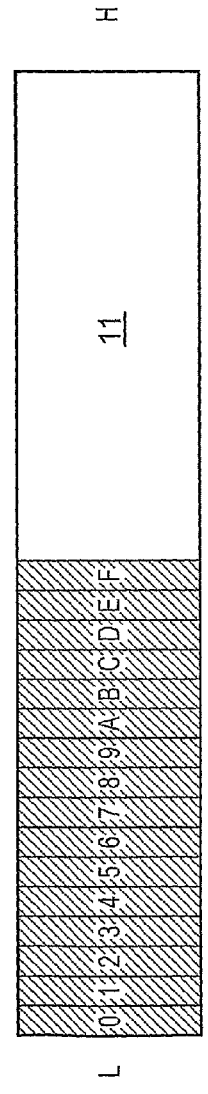

FIG. 7 illustrates the compression of data in accordance with one embodiment of the invention. The uncompressed data set to be compressed is initially loaded into memory as shown in FIG. 7A and split or allocated into different data segments 0-F. The data segments are then compressed, generally at least partly in parallel with one another. The compressed data is written back to the memory section, with each compressed data segment being stored into the same memory section where the corresponding uncompressed data segment was previously stored. This leads to the situation shown in FIG. 7B. Finally, the compressed data segments are assembled together (defragmented) into the final output file, as shown in FIG. 7C. (The final output file may also be provided with a file header and/or TOC, as described above, but not shown in FIG. 7C). Thus the compressed data is produced and stored into the same memory space as the original decompressed data. In addition, various portions of the compression can be performed in parallel with one another without relative timing constraints.

The various methods set out above may be implemented by adaptation of an existing entertainment device, for example by using a computer program product comprising processor implementable instructions stored on a data carrier such as a floppy disk, optical disk, hard disk, PROM, RAM, flash memory or any combination of these or other storage media, or transmitted via data signals on a network such as an Ethernet, a wireless network, the Internet, or any combination of these of other networks, or realised in hardware as an ASIC (application specific integrated circuit) or an FPGA (field programmable gate array) or other configurable circuit suitable to use in adapting the existing equivalent device.

In conclusion, although a variety of embodiments have been described herein, these are provided by way of example only, and many variations and modifications on such embodiments will be apparent to the skilled person and fall within the scope of the present invention, which is defined by the appended claims and their equivalents.

The invention claimed is:

1. A method of decompressing a compressed data set using a processing device having a plurality of processing units and a shared memory, the compressed data set comprising a plurality of compressed data segments, in which each compressed data segment corresponds to an uncompressed size of uncompressed data, the method comprising:
   loading the compressed data set into said shared memory so that each compressed data segment is stored into a respective non-overlapping memory region of said shared memory, wherein the respective memory region has a size equal to the uncompressed size of the corresponding uncompressed data segment;
   decompressing the compressed data segments with one or more of the processing units using buffer memory associated with the one or more processing units, the buffer memory being separate from the shared memory; and
   storing each decompressed data segment back to its respective memory region within said shared memory;
   wherein the loading comprises:
      loading the compressed data set into the shared memory so that the plurality of compressed data segments are arranged contiguously within the shared memory; and
      fragmenting the compressed data set into the plurality of compressed data segments so that each compressed data segment is stored into the respective memory region of the shared memory.

2. The method of claim 1, wherein each of the data segments has the same uncompressed size of uncompressed data.

3. The method of claim 2, wherein the buffer memory associated with each processing unit has a local output buffer for holding data prior to storing back to shared memory, and wherein the local output buffer has a size equal to the uncompressed size of uncompressed data.

4. The method of any preceding claim, wherein the data segments can be decompressed independently of one another.

5. The method according to claim 1, wherein the compressed data set is loaded into a portion of memory equal to the size of the uncompressed data set.

6. The method of claim 1, wherein the compressed data set is located at one end of the memory portion and the fragmenting comprises moving or copying the compressed data segments in turn away from said one end towards the opposite end, starting with the compressed data segment furthest from said one end.

7. The method of claim 1, wherein the fragmenting is performed as a serial process.

8. The method of claim 7, wherein the fragmenting is performed by one of the processing units.

9. The method of claim 1, wherein each respective memory region is arranged contiguously within the shared memory.

10. Apparatus for decompressing a compressed data set, the compressed data set comprising a plurality of compressed data segments, in which each compressed data segment corresponds to an uncompressed size of uncompressed data, the apparatus comprising:
   a plurality of processing units, each of the plurality of processing units being associated with a buffer memory; and
   a shared memory separate from the buffer memory;
   in which the apparatus is configured to:
   load the compressed data set into said shared memory so that each compressed data segment is stored into a respective non-overlapping memory region of said shared memory, wherein the respective memory region has a size equal to the uncompressed size of the corresponding uncompressed data segment;
   decompress the compressed data segments with one or more of the processing units using the buffer memory;
   wherein the apparatus is further configured to:
      load the compressed data set into the shared memory so that the plurality of compressed data segments are arranged contiguously within the shared memory; and
      fragment the compressed data set into the plurality of compressed data segments so that each compressed data segment is stored into the respective memory region of the shared memory.

11. The apparatus of claim 10, in which each respective memory region is arranged contiguously within the shared memory.

12. A non-transitory computer-readable medium having instructions stored thereon, the instructions, when executed by a processor, cause the processor to perform a method of decompressing a compressed data set, the processor having a plurality of processing units and a shared memory, the compressed data set comprising a plurality of compressed data segments, each compressed data segment corresponding to an uncompressed size of uncompressed data, the method comprising the steps of:
   loading the compressed data set into said shared memory so that each compressed data segment is stored into a respective non-overlapping memory region of said shared memory, wherein the respective memory region has a size equal to the uncompressed size of the corresponding uncompressed data segment;
   decompressing the compressed data segments with one or more of the processing units using buffer memory associated with the one or more processing units, the buffer memory being separate from the shared memory; and storing each decompressed data segment back to its respective memory region within said shared memory;

wherein the loading comprises:

loading the compressed data set into the shared memory so that the plurality of compressed data segments are arranged contiguously within the shared memory; and fragmenting the compressed data set into the plurality of compressed data segments so that each compressed data segment is stored into the respective memory region of the shared memory.

13. The computer-readable medium of claim 12, wherein each of the data segments has the same uncompressed size of uncompressed data.

14. The computer-readable medium of claim 12, wherein the data segments can be decompressed independently of one another.

15. The computer-readable medium of claim 12, wherein the compressed data set is loaded into a portion of memory equal to the size of the uncompressed data set.

16. The computer-readable medium of claim 12, wherein the compressed data set is located at one end of the memory portion and the fragmenting comprises moving or copying the compressed data segments in turn away from said one end towards the opposite end, starting with the compressed data segment furthest from said one end.

17. The computer-readable medium of claim 12, wherein the fragmenting is performed as a serial process.

18. The computer-readable medium of claim 17, wherein the fragmenting is performed by one of the processing units.

19. The computer-readable medium of claim 12, wherein each respective memory region is arranged contiguously within the shared memory.

* * * * *